(12) United States Patent
Honda et al.

(10) Patent No.: US 8,627,157 B2
(45) Date of Patent: Jan. 7, 2014

(54) STORING APPARATUS

(75) Inventors: Hirofumi Honda, Machida (JP); Naru Hamada, Tokyo (JP); Toshinori Koba, Kawasaki (JP); Koji Ogaki, Koza-gun (JP); Keiichi Inoue, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 356 days.

(21) Appl. No.: 13/051,617

(22) Filed: Mar. 18, 2011

(65) Prior Publication Data

US 2011/0246841 A1 Oct. 6, 2011

(30) Foreign Application Priority Data

Mar. 30, 2010 (JP) ................................. 2010-077997

(51) Int. Cl.
*G11C 29/00* (2006.01)

(52) U.S. Cl.
USPC .......................................... 714/710; 714/723

(58) Field of Classification Search
USPC .......................................... 714/721, 710, 723
See application file for complete search history.

(56) References Cited

U.S. PATENT DOCUMENTS

| | | | | |
|---|---|---|---|---|
| 5,812,639 | A * | 9/1998 | Bartholomew et al. | 370/352 |
| 6,411,394 | B1 * | 6/2002 | Nakamura et al. | 358/1.15 |
| 6,629,123 | B1 * | 9/2003 | Hunt | 718/106 |
| 6,829,190 | B1 * | 12/2004 | Snyder et al. | 365/211 |
| 7,343,514 | B2 * | 3/2008 | Yamato et al. | 714/6.12 |
| 7,813,176 | B2 * | 10/2010 | Hunt | 365/185.08 |
| 7,920,200 | B2 * | 4/2011 | Azuma | 348/335 |
| 7,944,501 | B2 * | 5/2011 | Suzuki | 348/370 |
| 8,276,018 | B2 * | 9/2012 | Kursun et al. | 714/10 |
| 8,286,028 | B2 * | 10/2012 | Matsuda et al. | 714/6.24 |
| 2001/0043761 | A1 * | 11/2001 | Shimizu et al. | 382/325 |
| 2002/0040433 | A1 * | 4/2002 | Kondo | 713/180 |
| 2002/0101257 | A1 * | 8/2002 | Kawahara et al. | 326/38 |
| 2003/0171850 | A1 * | 9/2003 | Kobayashi et al. | 700/272 |
| 2003/0179712 | A1 * | 9/2003 | Kobayashi et al. | 370/249 |
| 2004/0044649 | A1 * | 3/2004 | Yamato et al. | 707/1 |
| 2004/0141204 | A1 * | 7/2004 | Sakai et al. | 358/1.16 |
| 2004/0237103 | A1 * | 11/2004 | Kondo et al. | 725/37 |
| 2005/0034041 | A1 * | 2/2005 | Casarsa | 714/733 |
| 2005/0134942 | A1 * | 6/2005 | Kondo et al. | 358/479 |
| 2006/0002199 | A1 * | 1/2006 | Nakajima et al. | 365/189.12 |
| 2006/0015508 | A1 * | 1/2006 | Kondo et al. | 707/10 |
| 2006/0067164 | A1 * | 3/2006 | Takai et al. | 367/198 |
| 2007/0146529 | A1 * | 6/2007 | Suzuki | 348/333.01 |
| 2007/0286244 | A1 * | 12/2007 | Koyabu et al. | 370/498 |
| 2008/0147961 | A1 * | 6/2008 | Seki et al. | 711/100 |
| 2008/0155133 | A1 * | 6/2008 | Honjo et al. | 710/19 |
| 2008/0220724 | A1 * | 9/2008 | Roh et al. | 455/66.1 |
| 2008/0263667 | A1 * | 10/2008 | Kondo | 726/23 |
| 2008/0320317 | A1 * | 12/2008 | Funahashi et al. | 713/189 |

(Continued)

FOREIGN PATENT DOCUMENTS

JP 2003-085054 3/2003

*Primary Examiner* — Cynthia Britt
(74) *Attorney, Agent, or Firm* — Cowan, Liebowitz & Latman, P.C.

(57) ABSTRACT

A storing apparatus, equipped with a control unit configured to control the writing of data into a memory and to communicate a notice to an external device with a communication unit if the remaining amount of substitute blocks becomes equal to or less than a threshold value specified by stored threshold value information, includes the control unit configured to change the threshold value information, used for the notice communicated by the control unit, by the use of threshold value information received from the external device with the communication unit.

11 Claims, 4 Drawing Sheets

(56) References Cited

U.S. PATENT DOCUMENTS

| | | |
|---|---|---|
| 2009/0070543 A1* | 3/2009 | Oh et al. ........................ 711/170 |
| 2009/0111486 A1* | 4/2009 | Burstrom .................... 455/456.3 |
| 2009/0113485 A1* | 4/2009 | Inukai ............................. 725/58 |
| 2009/0235103 A1* | 9/2009 | Yamashiro .................... 713/324 |
| 2010/0023672 A1* | 1/2010 | Gorobets et al. .............. 711/103 |
| 2010/0318844 A1* | 12/2010 | Matsuda et al. ................... 714/6 |
| 2011/0007901 A1* | 1/2011 | Ikeda et al. .................... 380/270 |
| 2011/0019974 A1* | 1/2011 | Konoshima .................... 386/284 |
| 2011/0055481 A1* | 3/2011 | Murakami ..................... 711/118 |
| 2011/0157319 A1* | 6/2011 | Mashitani et al. ............... 348/49 |
| 2011/0193861 A1* | 8/2011 | Mashitani et al. ............. 345/419 |
| 2011/0238927 A1* | 9/2011 | Hatano ......................... 711/145 |

\* cited by examiner

STORING APPARATUS

BACKGROUND OF THE INVENTION

1. Field of the Invention

The present invention relates to a storing apparatus, and more particularly to a storing apparatus equipped with a flash memory.

2. Description of the Related Art

In recent years, a semiconductor storing apparatus having a large storage capacity, such as a flash memory, has been used in various devices in order to store data.

A flash memory performs the writing and the reading of data on a unit basis of what is called a block, and may happen to include a defective block to which data writing cannot effected normally owing to the manufacturing process of the memory or a subsequently happened cause. Accordingly, the flash memory is arranged to have a portion of a storage area thereof as a substitute block for such a defective block so that the data to be written into the defective block is written instead into the substitute block. Moreover, the technique of informing a user of a warning when the remaining amount of substitute blocks becomes smaller than a set value was also proposed (see, for example, Japanese Patent Application Laid-Open Publication No. 2003-085054).

A detachable storing apparatus, such as a memory card, equipped with a flash memory is used to be mounted on various host devices. A host device has its specific type of data to be treated, size of data to be written, data rate, and the like, which are different from those of other host devices, respectively. Even if the lowering of the remaining amount of substitute blocks is, consequently, warned in the conventional manner, it may happen depending on the host device that the remaining amount of the substitute blocks is really not enough for the capacity to be secured at the time of writing data to cause a writing error.

For example, in the case of a host device in which the amount of data to be written at one time is large, the probability of using many substitute blocks at one time of writing is higher than that of a device in which the amount of data to be written at one time is small.

SUMMARY OF THE INVENTION

A scope of the invention is to solve the problem like this and provide an apparatus capable of suitably informing a user of the state of the remaining amount of substitute blocks in accordance with a host device.

A storing apparatus of the present invention comprises: a communication unit configured to communicate with an external device; a register arranged to store information temporarily; a memory having a plurality of blocks including substitute blocks for defective blocks; and a control unit configured to control writing data into the memory, and to communicate a notice to the external device with the communication unit if a remaining amount of the substitute blocks becomes equal to or less than a threshold value specified by threshold value information stored in the register, wherein the control unit reads out threshold value information from the memory to store the read-out threshold value information into the register, and changes the threshold value information stored in the register by using threshold value information received from the external device with the communication unit.

Further features of the present invention will become apparent from the following description of exemplary embodiments with reference to the attached drawings.

DESCRIPTION OF THE EMBODIMENTS

Exemplary embodiments of the present invention will now be described in detail in accordance with the accompanying drawings.

First Embodiment

Figure 1A:
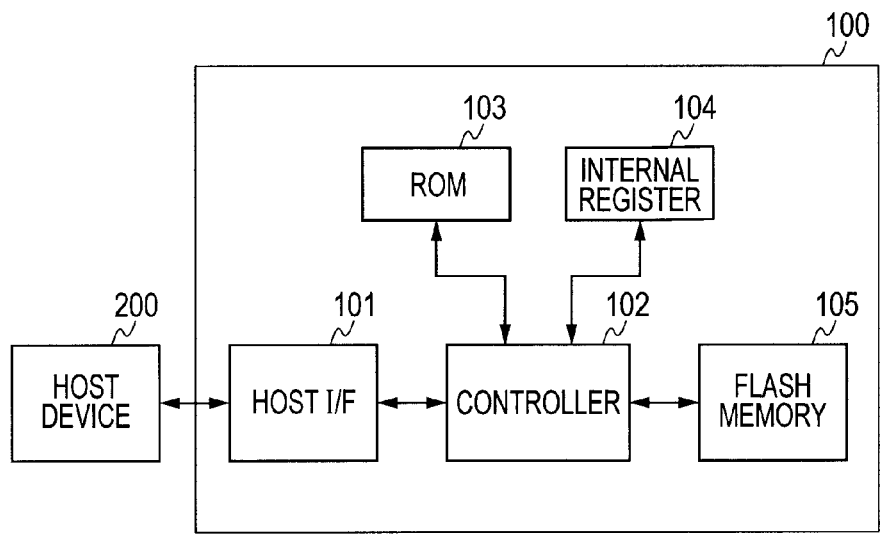
FIGS. 1A and 1B are diagrams illustrating the configuration of a system composed of a storing apparatus according to an embodiment of the present invention and a host device, and the configuration of the storing area of a flash memory.

FIG. 1A is a block diagram illustrating the configuration of a system using a storing apparatus 100 according to the present embodiment. The system of FIG. 1A is composed of the storing apparatus 100 and a host device 200. The storing apparatus 100 executes the process such as writing and reading out data in accordance with various commands from the host device 200. The storing apparatus 100 may, moreover, take a form of a memory card or the like, and the host device 200 is equipped with a not-illustrated mounting and ejecting mechanism which can easily attain mounting and ejecting the storing apparatus 100 on and from the host device 200.

In the storing apparatus 100, a host interface (I/F) 101 communicates commands and data between the host device 200 and the storing apparatus 100. In the present embodiment, the host I/F 102 communicates with the host device 200 in conformity with the specifications of Advanced Technology Attachment (ATA). A controller 102 includes a central processing unit (CPU) to control the operation of the storing apparatus 100 in accordance with a command received from the host device 200. A ROM 103 is a read-only memory, and stores a control program to be executed by the controller 102. The data stored in the ROM 103 cannot be rewritten by the host device 200. An internal register 104 temporarily stores the register information defined by a standard under the control of the controller 102. The controller 102 refers to the register information stored in the internal register 104 as the occasion demands to rewrite the resister information. The controller 102 moreover includes a flash memory interface (not illustrated) for transmitting and receiving data to and from a flash memory 105. The flash memory 105 is composed of a publicly known flash memory chip, and writes and reads out data under the control of the controller 102.

Figure 1B:
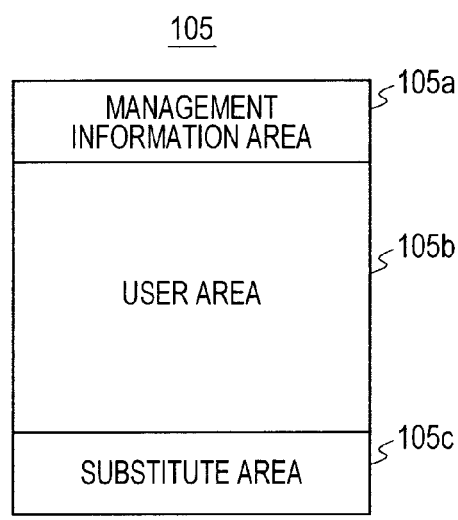

FIG. 1B is a diagram illustrating the configuration of the storing area of the flash memory 105. The storing area of the flash memory 105 is divided into a management information area 105a, a user area 105b, and a substitute area 105c in accordance with the addresses of the flash memory 105. The management information area 105*a* stores the information of a file managing table for managing the areas of stored data, a conversion table for showing the correspondences between address spaces of logical addresses and physical addresses, a substitute area managing table for managing usage statuses of substitute areas, and the like. The management information area 105*a* further stores threshold value information to be used at the time of warning the lowering of the remaining amount of substitute blocks; specific information such as the identifier (ID), the manufacturer code, a password, and the like of the storing apparatus 100; and information indicating performances, such as a memory size, an access speed, and the like. Moreover, the management information area 105*a* also stores backup data including control information to be used for communicating with the host device 200, such as the number of defective blocks and the number of remaining substitute areas.

At the time of mount processing of the storing apparatus 100, the controller 102 reads out these pieces of management information from the management information area 105*a* to store the read-out management information into the internal register 104 as register information. Moreover, the controller 102 updates the management information stored in the internal register 104 at the time of the writing or the reading-out of data by the host device 200. The controller 102 further copies the updated management information stored in the internal register 104 into the management information area 105*a* at suitable timing to backup the information. As described later, the controller 102 does, however, not copy the threshold value information stored in the internal register 104 into the management information area 105*a*. The timing of copying is, for example, every time for a regular interval or the time of a disconnection of the communication between the storing apparatus 100 and the host device 200.

The user area 105*b* is an area for storing the data transmitted from the host device 200. The substitute area 105*c* is assigned as an area in which the data to be recorded in a defective block is written when the defective block has been produced in the user area 105*b*.

Figure 2:
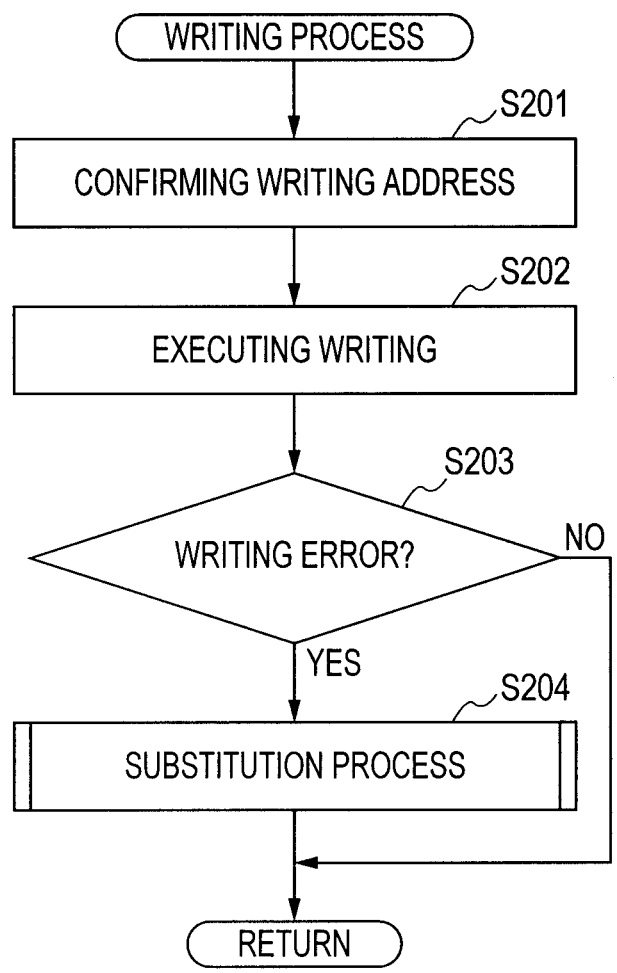
FIG. 2 is diagram illustrating a flow chart of data writing process into the storing apparatus of the present invention.

A writing process of data in the storing apparatus 100 will next be described. FIG. 2 is a flow chart illustrating the writing process. The process illustrated in FIG. 2 is attained by the control of the controller 102 according to, for example, a control program stored in the ROM 103 or a control program loaded from an external apparatus.

When the host I/F 101 receives a data writing command and the data from the host device 200, the controller 102 starts the flow. The controller 102, first, confirms the received writing address (S201). The controller 102 then writes the received data into the designated address of the flash memory 105 (S202). The controller 102 next checks whether any writing errors of the written data have occurred or not (S203). A publicly known method can be used for the checking process of the writing errors.

If a writing error has occurred, the controller 102 executes substitution process (S204). Moreover, if no writing errors have occurred and the data writing has normally been completed, the controller 102 waits the next command. The controller 102 assigns an address of the flash memory 105 (physical address) to an address (logical address) instructed from the external device, and produces a conversion table showing the correspondences between each logical address and each physical address. Then, when a defective block occurs, the controller 102 changes the conversion table in order that the physical address of a substitute block may be assigned to the designated logical address. The controller 102 saves the changed conversion table into the management information area 105*a*.

Figure 3:
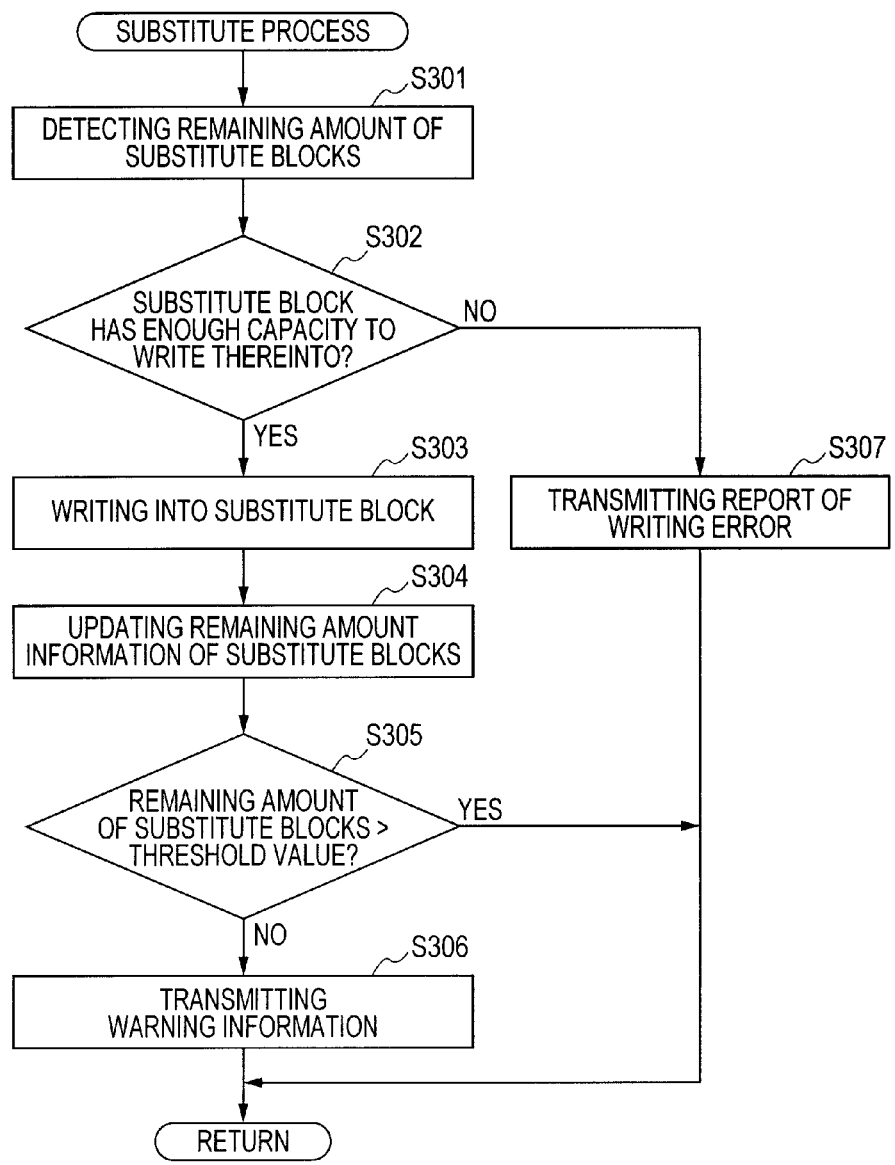
FIG. 3 is a diagram illustrating a flow chart of substitution process executed in the data writing process into the storing apparatus of the present invention.

FIG. 3 is a flow chart illustrating the substitution process at the step S204. The controller 102 first detects the remaining amount of substitute blocks in the substitute area 105*c* of the flash memory 105 (S301). In the present embodiment, when the storing apparatus 100 is mounted on the host device 200, or when the power source of the host device 200 is activated, the controller 102 reads out the remaining amount information of the substitute blocks from the management information area 105*a* to stored the read-out information into the internal register 104. In the present embodiment, the remaining amount is, consequently, detected by the remaining amount information of the substitute blocks stored in the internal register 104.

The controller 102 checks whether the substitute blocks have enough capacity to write the data thereinto or not in a case in which the result of the detection of the remaining amount of the substitute blocks shows that the remaining amount of the substitute blocks exists (not zero) (S302). If the remaining amount of substitute blocks does not exist, the controller 102 transmits a report indicating the writing error to the host device 200 through the host I/F 101 (S307).

On the other hand, if the remaining amount of substitute blocks exists to be enough to write the data, the controller 102 writes the data into any one of the remaining substitute blocks (S303). Then, the controller 102 updates the content of the remaining amount information of the substitute blocks which information is stored in the internal register 104 in order to decrease the remaining amount by the number of used substitute blocks (S304). The controller 102 next compares the remaining amount of the substitute blocks after the update and a threshold value to check whether the remaining amount of the substitute blocks is larger than the threshold value or not (S305). The threshold value will be described later. The internal register 104 is a volatile memory in order to store data temporarily. When the information of the internal register 104 changes, the controller 102 performs the backup of the information into the management information area 105*a* of the flash memory 105.

If the remaining amount of the substitute blocks is larger than the threshold value, the controller 102 terminates the process as it is. On the other hand, if the remaining amount of the substitute blocks is equal to or less than the threshold value, the controller 102 transmits warning information indicating that the remaining amount of the substitute blocks is small to the host device 200 through the host I/F 101 (alarming unit) (S306).

The processing of the threshold value information of a remaining amount of substitute blocks in the storing apparatus 100 will, next, be described. In the storing apparatus 100, when the storing apparatus 100 is mounted on the host device 200, or when the storing apparatus 100 performs mount process at the time of the power activation thereof, the storing apparatus 100 reads out the threshold value information stored in the management information area 105*a* of the flash memory 105 beforehand to store the read-out threshold value information into the internal register 104. Furthermore, if the storing apparatus 100 receives a rewrite request of the threshold value information from the host device 200, the storing apparatus 100 rewrites the threshold value information stored in the internal register 104 by using the threshold value information transmitted from the host device 200.

Figure 4A:
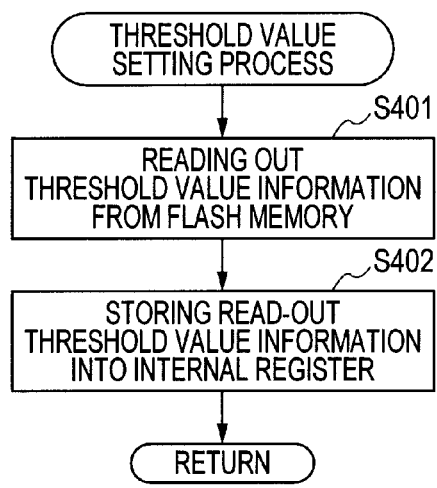
FIGS. 4A and 4B are diagrams illustrating flow charts of the setting process of threshold value information used in the substitution process of the present invention.

FIG. 4A is a flow chart illustrating a threshold value information storing process executed in a mount process of the storing apparatus 100. Incidentally, the mount process is the process of reading out various pieces of management information from the management information area 105a of the flash memory 105 and storing the read-out management information into the internal register 104 to put the storing apparatus 100 in a state capable of communicating with the host device 200.

In the mount process, the controller 102 reads out threshold value information of substitute blocks from the management information area 105a of the flash memory 105 (S401). The controller 102 then stores the read-out threshold value information into the internal register 104 (S402). At this time, the controller 102 stores the threshold value information into the vender unique area of the internal register 104. Moreover, a previously determined value in consideration of the characteristics and the like of the storing apparatus 100 is set the threshold value designated by the threshold value information.

Figure 4B:
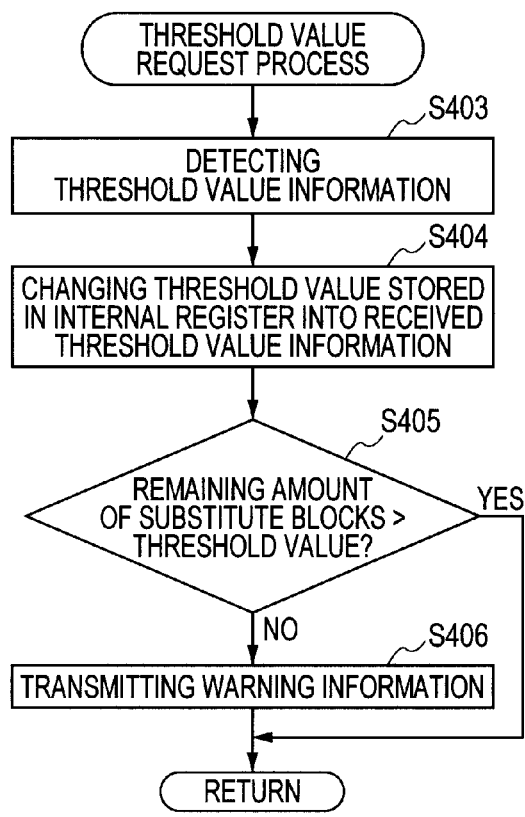

FIG. 4B is a flow chart illustrating the change process of the threshold value information based on a change instruction of the threshold value information from the host device 200. In the present embodiment, the host device 200 requests the storing apparatus 100 to perform the change of the threshold value information by using a Self-Monitoring, Analysis and Reporting Technology (SMART) command of an ATA interface.

In FIG. 4B, if the host I/F 101 receives a change command of threshold value information from the host device 200, the controller 102 detects the threshold value information transmitted together with the command (S403). The controller 102 then changes the threshold value information stored in the internal register 104 with the detected threshold value information (S404). Specifically, the controller 102 changes the threshold value information stored in the internal register into the threshold value information transmitted from the host device 200. At this time, the controller 102 does not updates the threshold value information stored in the management information area 105a with the threshold value information rewritten by the host device 200.

The controller 102 next compares the changed threshold value with the remaining amount of the substitute blocks to check whether the remaining amount of the substitute blocks is larger than the threshold value or not (S405). If the remaining amount of the substitute blocks is larger than the threshold value, the controller 102 terminates the process as it is. On the other hand, if the remaining amount of the substitute blocks is equal to or less than the threshold value, the controller 102 transmits warning information indicating that the remaining amount of the substitute blocks is small to the host device 200 through the host I/F 101 (S406).

On and after this step, the threshold value to be compared in the processing at the step S305 will be the threshold value designated by the threshold value information changed by the host device 200. Consequently, it is possible to set the threshold value suitable for the size of data written by the host device 200 and the type of the data.

The threshold value information set by the host device 200 in such a way is not copied into the management information area 105a by the controller 102. Consequently, if the storing apparatus 100 having the threshold value information set by the host device 200 is ejected by the host device 200 and is mounted on another host device, then the storing apparatus 100 again reads out threshold value information from the management information area 105a of the flash memory 105 to store the read-out threshold value into the internal register 104. That is, the storing apparatus 100 reads out the threshold value information from the management information area 105a to store the read-out threshold value information into the internal register 104 as the initial value of the threshold value at every mount process of the storing apparatus 100. There will consequently be no chances of comparing a threshold value set by another host device with a remaining amount of substitute blocks.

Incidentally, although a piece of threshold value information is stored in the management information area 105a in the present embodiment, the present embodiment may also be arranged to prepare a plurality of pieces of threshold value information indicating values different from one another and to automatically change the threshold value to be set according to the size of data to be written at one time by the host device 200.

For example, two pieces of threshold value information indicating a threshold value 1 and a threshold value 2 (threshold value 1>threshold value 2), respectively, are arranged to be stored in the management information area 105a. Then, if the size of the data to be written in conformity with a data writing command from the host device 200 is larger than a predetermined size, the threshold value 1 is written into the internal register 104; otherwise the threshold value 2 is stored in the internal register 104.

Moreover, the plurality of pieces of threshold value information may also be selected according to the type of data to be written by the host device 200. The storing apparatus 100 may also be configured as follows: for example, if the data to be written is image data of a moving image, a still image, or the like, then the controller 102 selects the threshold value 1; if the data is document data, then the controller 102 selects the threshold value 2. Moreover, three or more pieces of threshold value information may be prepared.

Moreover, the storing apparatus 100 may also be arranged as follows: zero is set as the threshold value information stored in the management information area 105a, and then zero is stored in the internal register 104 as the initial value of the threshold value at the time of mount process. This case results in transmitting no warnings to the host device 200 until the remaining amount of substitute blocks becomes zero. Because some host devices need no warnings, the storing apparatus 100 configured as described above may avoid transmitting warnings hollowly to such host devices.

As described above, the present embodiment rewrites the threshold value information stored in the internal register 104 by using the threshold value information transmitted from the host device 200 at the time of mount processing. The threshold value of the remaining amount of substitute blocks suitable for the host device 200 can consequently be set.

Moreover, because the present embodiment reads out threshold value information from the management information area 105a to store the read-out threshold value information into the internal register 104 at every mount process, the present embodiment may avoid also comparing the threshold value set by the host device 200 beforehand with the remaining amount of substitute blocks.

Second Embodiment

Figure 5:
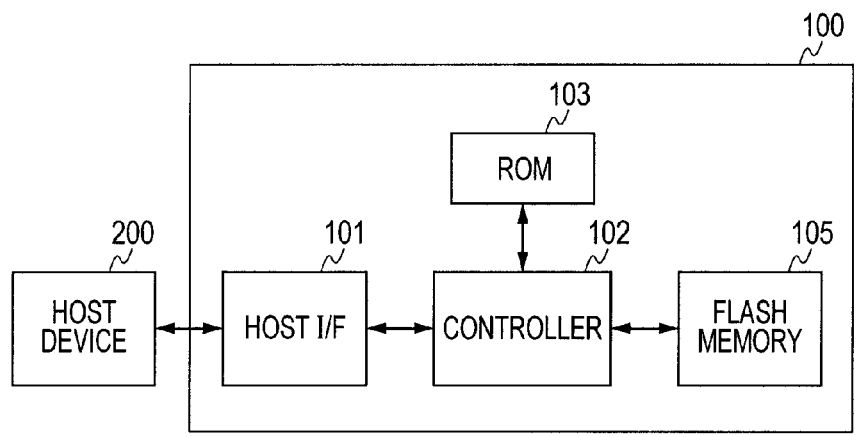
FIG. 5 is a diagram illustrating the configuration of a system composed of a storing apparatus according to the other embodiment of the present invention and a host device.

A second embodiment will, next, be described. FIG. 5 is a diagram illustrating the configuration of a system according to the second embodiment, and the same components as those illustrated in FIG. 1 are denoted by the same numerals as those illustrated in FIG. 1. The storing apparatus 100 of the present embodiment is not equipped with the internal register 104 of the storing apparatus 100 illustrated in FIG. 1.

The present embodiment is arranged to store threshold value information into the ROM 103 beforehand in addition to the control program of the controller 102. The threshold value information is then read-out from the ROM 103, and the threshold value information stored in the management information area 105a is updated at the time of the mount process of the storing apparatus 100 of the present embodiment. After that, if the storing apparatus 100 receives a change request of the threshold value information from the host device 200, the storing apparatus 100 changes the threshold value information stored in the management information area 105a by using the threshold value information transmitted from the host device 200. At the time of the substitution process illustrated in FIG. 3, the storing apparatus 100 compares the threshold value information stored in the management information area 105a and the remaining amount of substitute blocks to inform the host device 200 of warning information.

As described above, in the present embodiment, threshold value information is read-out from the ROM 103 and the threshold value information stored in the management information area 105a of the flash memory 105 is updated at the time of mount process. So, the threshold value information stored in the management information area 105a of the flash memory is reset to the threshold value information stored in the ROM 103 every time the mount process is executed. Then, the threshold value information stored in the management information area 105a is changed by the host device 200, and thereby the threshold value of the remaining amount of substitute blocks suitable for the host device 200 can be set.

Third Embodiment

In the second embodiment, threshold value information is read out from the ROM 103 at the time of mount processing of the storing apparatus 100 to update the threshold value information stored in the management information area 105a. On the other hand, in the present embodiment, threshold value information is read out from the ROM 103 at the time of unmount process of the storing apparatus 100 to update the threshold value information stored in the management information area 105a Incidentally, the system configuration of the present embodiment is the same as that of the second embodiment, and the description thereof is accordingly omitted here. Moreover, the unmount process is the process for disconnecting the communication with the host device 200 when the power source of the host device 200 is turned off or when the storing apparatus 100 is ejected from the host device 200.

Incidentally, also in the present embodiment, if the storing apparatus 100 receives a request of changing the threshold value information from the host device 200 while the system is operating, the storing apparatus 100 changes the threshold value information stored in the management information area 105a at the time of unmount process. Then, in the substitution process illustrated in FIG. 3, the storing apparatus 100 compares the threshold value information stored in the management information area 105a with the remaining amount of substitute blocks to inform the host device 200 of warning information.

As described above, in the present embodiment, threshold value information is read out from the ROM 103 at the time of unmount process to update the threshold value information stored in the management information area 105a of the flash memory 105. Consequently, even if the threshold value information stored in the management information area 105a is erased or changed by mistake by the host device 200, the threshold value information stored in the management information area 105a can be initialize by the threshold value information stored in the ROM 103.

Moreover, the second and the third embodiments may also be arranged to store a plurality of pieces of threshold value information into the ROM 103, select and read out any one piece of the plurality of pieces of threshold value information, and store the read-out piece of threshold value information into the management information area 105a similarly to the first embodiment.

Moreover, the process of the embodiments described above may also be carried out by the program codes of software realizing the respective functions, which software is recorded on a storing medium provided to the system or the apparatus. The computer (or the CPU or the microprocessor unit (MPU)) of the system or the apparatus then reads out and executes the program codes stored in the storing medium, and thereby the functions of the embodiments described above can be realized. In this case, the program codes read-out from the storing medium themselves result in realizing the functions of the embodiments described above, and the storing medium storing the program codes constitutes the present invention. As the storing medium for supplying such program codes, for example, a floppy (registered trademark) disk, a hard disk, an optical disk, or a magneto-optical disk can be used. Alternatively, a compact disc read-only memory (CD-ROM), a compact disc-recordable (CD-R), magnetic tape, a nonvolatile memory card, a ROM, or the like can also be used.

The present invention has hereinbefore been described in detail on the basis of its preferable embodiments, but the present invention is not limited to those specific embodiments. Various modes without departing from the spirit and scope of the invention are also included in the present invention. Furthermore, each embodiment described above expresses only an embodiment of the present invention, and it is also possible to suitably combine each embodiment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-077997 filed on Mar. 30, 2010, which is hereby incorporated by reference herein in its entirety.

What is claimed is:

1. A storing apparatus, comprising:
a communication unit configured to communicate with an external device;
a register arranged to store information temporarily;
a memory configured to have a plurality of blocks including substitute blocks for defective blocks and to store threshold value information, which is used for warning lowering of a remaining amount of the substitute blocks in the memory, indicating a predetermined value;
a control unit configured to control writing data into the memory,
wherein the control unit reads out the threshold value information from the memory and stores the read-out threshold value information into the register,
wherein the control unit updates, in accordance with an update instruction from the external device received by the communication unit, the threshold value information read-out from the memory and stored in the resister with threshold value information received from the external device,
wherein the control unit compares a threshold value indicated by the updated threshold value information stored in the resister and a remaining amount of the substitute blocks in the memory and transmits a predetermined notice to the external device by the communication unit in accordance with the remaining amount of the substitute blocks being equal to or less than the threshold value indicated by the updated threshold value information stored in the register, and wherein the updated threshold value is inhibited from being copied from the resister to the memory by the control unit.

2. The storing apparatus according to claim 1, wherein the memory stores a plurality of pieces of the threshold value information, and the control unit selects any one of the plurality of pieces of the threshold value information and reads out the selected threshold value information from the memory to store the read-out threshold value information into the register.

3. The storing apparatus according claim 1, wherein the control unit further reads out control information used for the communication by the communication unit from the memory to store the read-out control information into the register, and changes the control information stored in the register in accordance with writing data into the memory.

4. The storing apparatus according to claim 1, wherein the control unit reads out threshold value information from the memory to store the read-out threshold value information into the register in accordance with executing a mount process for starting the communication between the communication unit and the external device.

5. The storing apparatus according to claim 4, wherein the control unit reads out the threshold value information from the read-only memory to update the threshold value information in the storing unit updated by the external device with the read-out threshold value information in accordance with executing a mount process for starting the communication between the communication unit and the external device.

6. The storing apparatus according to claim 4, wherein the control unit reads out the threshold value information from the read-only memory to update the threshold value information in the storing unit updated by the external device with the read-out threshold value information in accordance with executing an unmount process for disconnecting the communication between the communication unit and the external device.

7. The storing apparatus according to claim 4, wherein the read-only memory stores a plurality of pieces of the threshold value information, and the control unit selects any one of the plurality of pieces of the threshold value information and reads out the selected threshold value information from the read-only memory to store the read-out threshold value information into the storing unit.

8. The storing apparatus according to claim 1, wherein if the update instruction from the external device is not received, the control unit compares the predetermined value indicated by the threshold value information read out from the memory and stored into the resister and the remaining amount of the substitute blocks in the storing unit and to transmit the predetermined notice by the communication unit.

9. A storing apparatus, comprising:
a communication unit configured to communicate with an external device;
a storing unit configured to have a plurality of blocks including substitute blocks for defective blocks;
a read-only memory configured to store threshold value information, which is used for warning lowering of a remaining amount of the substitute blocks in the storing unit, indicating a predetermined value; and
a control unit configured to control writing data into the storing unit, wherein the control unit reads out the threshold value information from the read-only memory and stores the read-out threshold value information into the storing unit, wherein the control unit updates, in accordance with an update instruction from the external device received by the communication unit, the threshold value information read-out from the read-only memory and stored in the storing unit with threshold value information received from the external device, wherein the control unit compares a threshold value indicated by the updated threshold value information stored in the storing unit and a remaining amount of the substitute blocks in the storing unit and to transmit a predetermined notice to the external device by the communication unit in accordance with the remaining amount of the substitute blocks being equal to or less than the threshold value indicated by the updated threshold value information stored in the storing unit, and wherein the control unit reads out the threshold value information from the read-only memory at a predetermined timing and updates the threshold value in the storing unit updated by the external device, with the read-out threshold value information.

10. A control method of a storing apparatus including a communication unit configured to perform communication with an external device, a register arranged to store information temporarily, a memory configured to have a plurality of blocks including substitute blocks for defective blocks and to store threshold value information, which is used for warning lowering of a remaining amount of the substitute blocks in the memory, indicating a predetermined value, and a control unit configured to control writing data into the memory, the method comprising the steps of:

reading out, by the control unit, the threshold value information from the memory to store the read-out threshold value information into the register;

updating, by the control unit in accordance with an update instruction from the external device received by the communication unit, the threshold value information read-out from the memory and stored in the resister with threshold value information received from the external device, and comparing, by the control unit, a threshold value indicated by the updated threshold value information stored in the resister and a remaining amount of the substitute blocks in the memory and transmits a predetermined notice to the external device by the communication unit in accordance with the remaining amount of the substitute blocks being equal to or less than the threshold value indicated by the updated threshold value information stored in the register, wherein the updated threshold value is inhibited from being copied from the resister to the memory by the control unit.

11. A control method of a storing apparatus including a communication unit configured to communicate with an external device, a register arranged to communicate with an temporarily, a storing unit configured to have a plurality of blocks including substitute blocks for defective blocks, a read-only memory configured to store threshold value information, which is used for warning lowering of a remaining amount of the substitute blocks in the storing unit, indicating a predetermined value, and a control unit configured to control writing data into the storing unit, the method comprising the steps of:

reading out, by the control unit, the threshold value information from the read-only memory to store the read-out threshold value information into the storing unit;

updating, by the control unit in accordance with an update instruction from the external device received by the communication unit, the threshold value information read-out from the read-only memory and stored in the storing unit with threshold value information received from the external device, and comparing, by the control unit, a threshold value indicated by the updated threshold value information stored in the storing unit and a remaining amount of the substitute blocks in the storing unit and to transmit a predetermined notice to the external device by the communication unit in accordance with the remaining amount of the substitute blocks being equal to or less than the threshold value indicated by the updated threshold value information stored in the storing unit, wherein the threshold value information is read out by the control unit from the read-only memory at a predetermined timing to update the threshold value in the storing unit updated by the external device, with the read-out threshold value information.

* * * * *